United States Patent
Fenkes et al.

(10) Patent No.: US 7,546,565 B2
(45) Date of Patent: Jun. 9, 2009

(54) METHOD FOR COMPARING TWO DESIGNS OF ELECTRONIC CIRCUITS

(75) Inventors: Joachim Fenkes, Boeblingen (DE); Wilhelm Haller, Remshalden (DE); Tobias Werner, Weil im Schoenbuch (DE); Alexander Woerner, Boebingen (DE)

(73) Assignee: International Business Machines Corporation, Armonk, NY (US)

(*) Notice: Subject to any disclaimer, the term of this patent is extended or adjusted under 35 U.S.C. 154(b) by 57 days.

(21) Appl. No.: 11/622,017

(22) Filed: Jan. 11, 2007

(65) Prior Publication Data

US 2008/0172640 A1 Jul. 17, 2008

(51) Int. Cl.
*G06F 17/50* (2006.01)
(52) U.S. Cl. .............................. 716/5; 716/3
(58) Field of Classification Search ............ 716/3, 716/4, 5
See application file for complete search history.

(56) References Cited

U.S. PATENT DOCUMENTS

| | | | |
|---|---|---|---|
| 6,668,362 B1* | 12/2003 | McIlwain et al. | 716/5 |
| 2005/0091627 A1* | 4/2005 | Satapathy et al. | 716/12 |
| 2005/0172245 A1* | 8/2005 | Anderson | 716/3 |
| 2006/0200789 A1* | 9/2006 | Rittman | 716/19 |

OTHER PUBLICATIONS

Batra, P et al. "Hcompare: A Hierarchical Netlist Comparison Program", 29th ACM/IEEE Design Automation Conference, Jun. 8-12, 1992, pp. 299-304.*
"Hcompare: A Hierarchical Netllst Comparison Program", P. Batra et al., 29th ACM/IEEE Design Automation Conference, pp. 299-304, 1992.
"Hierarchical LVS Based on Hierarchy Rebuilding" by Wonjong Kim and Hyunchul Shin, Design Automation Conference 1998, ISBN: 0-7803-4425-1, Feb. 10-13, 1998, pp. 379-384.

* cited by examiner

*Primary Examiner*—Thuan Do
*Assistant Examiner*—Magid Y Dimyan
(74) *Attorney, Agent, or Firm*—Lynn L. Augspurger; Arthur Ortega (57) ABSTRACT

A method implemented as a computer program product for comparing two designs of electronic circuits, wherein the design representations comprise several hierarchically related sheets. The method comprises the steps of (a) identifying corresponding top-sheets of the first hierarchy level in the design versions; (b) generating a list of all sub-sheets for each top-sheet and comparing the lists to identify added, removed and common sheets of the corresponding top-sheets; (c) defining the common sheets as corresponding top-sheets of a next hierarchy level; and (d) repeating steps (a)-(c) until at least one of the top-sheets does not comprise any sub-sheet.

6 Claims, 7 Drawing Sheets

METHOD FOR COMPARING TWO DESIGNS OF ELECTRONIC CIRCUITS

BACKGROUND OF THE INVENTION

1. Field of the Invention

The present invention relates to the design of electronic circuits, especially integrated circuits like VLSIs (Very Large Scale Integrated Circuits).

2. Description of the Related Art

Often electronic circuit designs are specified at the behavioral level and are then transformed to the register transfer level (RTL), to the gate level, to the transistor level and finally to the layout description. Before manufacturing an electronic circuit, the final design has to be validated completely. As part of this validation, the functional equivalence will be verified between two representations of said electronic circuit design, the original schematic and the final layout that resulted from the schematic.

A schematic is a logical description of an electronic circuit, its elements and their interconnections. Examples for circuit elements are resistors, logic gates, and complete building blocks. A layout is a geometrical description of the physical implementation of an electronic circuit. Examples for such geometrical descriptions are shapes representing process masks used for the chip fabrication that represent actual physical layers, processing information or abstract placement information.

For example, "Hierarchical LVS Based on Hierarchy Rebuilding, Wongjong Kim and Hyunchul Shin, Proc. of the ASP-DAC 1998, page 379-page 384" and "Hcompare: A Hierarchical Netlist Comparison Program, Pradeep Batra and David Cooke, Proc. Of $29^{th}$ ACM/IEEE Design Automation Conference 1992, page 299-page 304" describe hierarchical layout vs. schematic verification (LVS) approaches, wherein a purely functional comparison of two hierarchical netlists is performed. Especially, for LVS approaches graphical information about the physical circuit implementation is used to extract a functional netlist only.

Among the various data structures used for circuit design representations, sheets are a description of a part of a circuit design comprising references to other sheets, potentially graphical information about the electronic circuit like wires or on-chip metal shapes, and meta-data like placement information for circuit elements, parameters for referenced sheets, or information about connections between electronic circuit elements. Especially, sheets may contain layout or schematic data structures.

A circuit design representation can be comprised of various sheets that build up hierarchical tree data structures based on references to other sheets within the sheets. Typically, a major design component has a single top-level sheet only, also called the top-sheet. If a first sheet contains a reference to a second sheet, then the second sheet is also called a sub-sheet of the first sheet. A reference to a sheet is called an instance of the referenced sheet within the sheet comprising the reference.

The comparison of different versions of a particular version of a hierarchical design is very helpful during the circuit design development. It allows retracing design modifications and helps understanding their effects on the functionality and properties of the corresponding electronic circuit.

Usual approaches perform a manual comparison sheet by sheet ignoring the hierarchical relationships between the sheets of an electronic circuit design. Consequently, manually traversing all sheets in the hierarchy is a time-consuming and error-prone task. Therefore, a method for automatically detecting design changes within a design hierarchy is needed.

The common solution to this problem is the so-called flattening of the sheet hierarchy: All referenced sheets are first incorporated into the top sheet, before carrying out the comparison. In this case, hierarchy information is lost and finding the specific sheet responsible for a design difference is tedious at best.

OBJECT OF THE INVENTION

It is therefore an object of the present invention to provide a method for automatically comparing electronic circuit design representations that is improved over the prior art and a corresponding computer program and computer-program product.

SUMMARY OF THE INVENTION

This object is achieved by the invention as defined in the independent claims. Further advantageous embodiments of the present invention are defined in the dependant claims.

The advantages of the present invention are achieved by using the hierarchy of sheets in order to reduce the number of detailed comparisons necessary to determine differences between two design versions of an electronic circuit. Differences in the sheet hierarchy are detected automatically wherein the affected sheets are flagged as such, giving the user a quick overview where modifications did occur.

The following terms are sued to characterize the relationships between a pair of sheets to be compared:

one selected member of the pair is the reference sheet and the other member is the compare sheet;

an instance stored in the reference sheet but not in the compare sheet is labeled "removed" as this instance needs to be removed from the reference sheet in order to transform the reference sheet into the compare sheet;

correspondingly an instance that is stored in the compare sheet but not in the reference sheet is labeled "added"; and correspondingly an instance stored in both sheets is labeled "common".

The terms "added", "removed", and "common" are used conterminously for parameters for referenced sheets, information about connections between electronic circuit elements, etc.

A method in accordance to the present invention comprises the following steps: In the first step the hierarchy of sheets is analyzed to identify added, removed and common sheets. In a further step, differences between common sheets are determined to identify modified sheets. Them, the combined hierarchies of said design versions are visualized, wherein added, removed and modified sheets are marked.

According to the present invention the hierarchies of the sheet representations of the design versions are analyzed automatically. This analysis comprises the following steps:

i. identifying corresponding top-sheets of a first hierarchy level in said design versions;

ii. generating a list of all sub-sheets for each top-sheet and comparing said lists to identify added, removed and common sheets of said corresponding top-sheets;

iii. defining said common sheets as corresponding top-sheets of a next hierarchy level; and iv. repeating steps ii to iv until at least one of the top-sheets does not comprise any sub-sheet.

This approach takes into account that in hierarchically organized electronic circuit designs the sheets contain references to other sheets. Defining those referenced sheets as top-sheets of a next hierarchy level allows generating a tree structure representing the relationships between the single sheets of a specific electronic circuit design representation. By identifying corresponding sheets among the hierarchies of different design versions, e.g. due to identical names, it is possible to compare the hierarchical tree structures of the sheet representations of said design versions. Especially, it is possible to identify added, removed and common sheets of a hierarchy level. Therefore, it is possible to determine differences already on the level of individual sheets. Consequently, the operating expense for comparing different design versions can be reduced significantly in relation to the state of the art.

After having identified the added and removed sheets in the hierarchical structure as differences between the design versions to be compared, only the common sheets have to be examined in more detail to discover differences. According to another advantageous embodiment of the present invention, first, the number of common sheets, which have to be compared in detail, is reduced by checking the trivial equality of common sheets. Checking trivial equality may comprise a comparison of file sizes and/or checksums, a comparison of file names and version numbers. By means of this checking it is possible to identify those common sheets which are not trivially equal and, thus, presumably modified. Then, only these presumably modified sheets are further explored by comparing the file contents in detail.

In a very advantageous embodiment of the present invention it is possible to select a pair of corresponding modified sheets by user interaction for detailed exploration. The implementation of the actual comparison of two sheets depends on the data type representation of the design versions to be compared.

If the design versions are schematics the present invention proposes the following steps:
i. generating a list of instances for each of the sheets to be compared to identify added, removed and common instances;
ii. generating a list of parameters for all common instances to identify added, removed and common parameters;
iii. comparing the values of said common parameters to determine changed parameters;
iv. generating a list of all network connections for all common instances to identify added, removed and common network connections;
v. comparing the network names of said common network connections to determine differences in instance connectivity; and
vi. storing for later visualization said lists to document differences between common instances.

If the design versions are layouts the detailed comparison may further comprise:
vii. generating a list of geometrical layers used in each corresponding layout to identify added, removed and common geometrical layers;
viii. comparing the common geometrical layers to determine geometrical differences and to classify said geometrical differences as added or removed geometrical details; and
ix. storing for later visualization said added and removed geometrical layers and said added and removed geometrical details to document geometrical differences between corresponding layouts.

BRIEF DESCRIPTION OF THE DRAWINGS

The present invention and its advantages are now described in conjunction with the accompanying drawings.

DETAILED DESCRIPTION OF THE INVENTION

Figure 1:
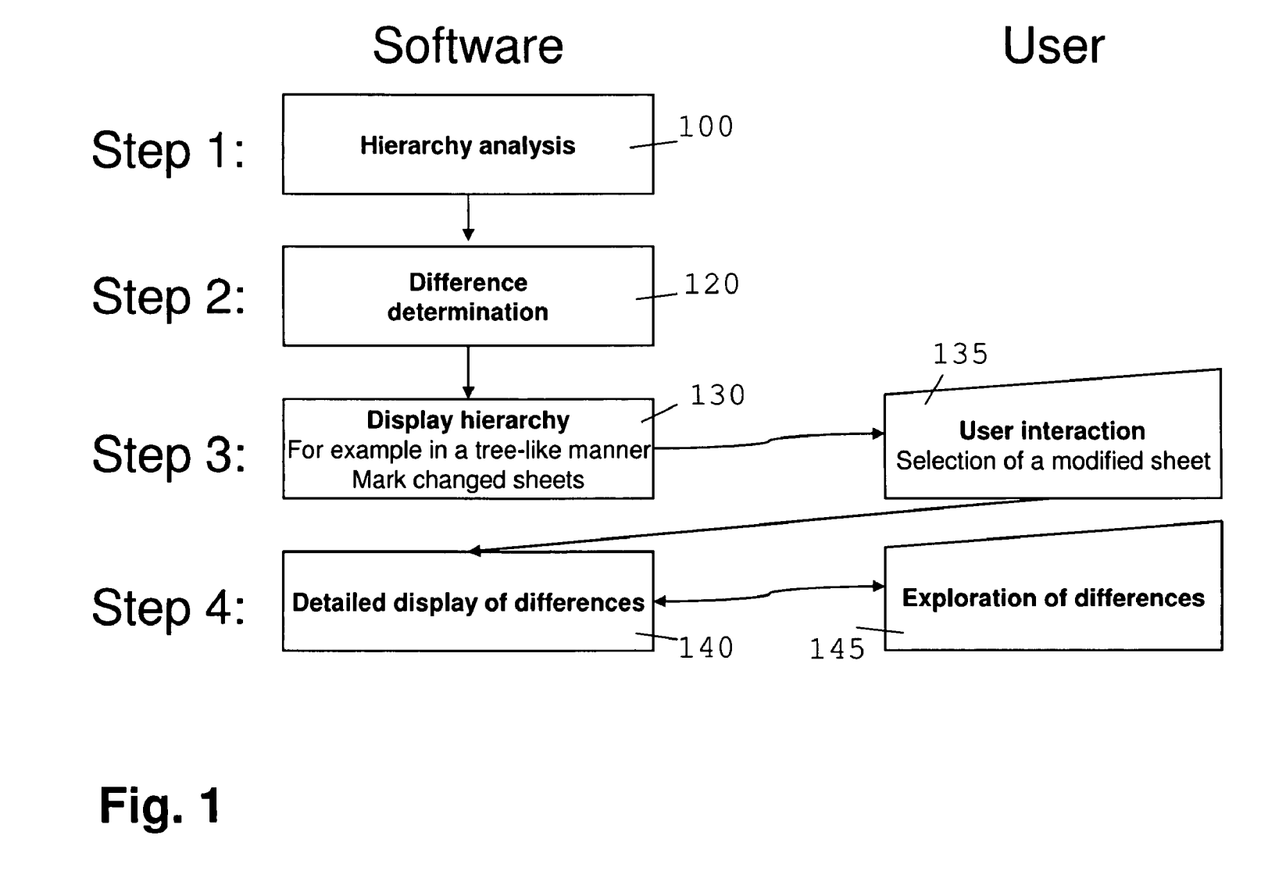
FIG. 1 shows steps of a method in accordance to the present invention.

The overall workflow given by the steps in FIG. 1 illustrates now only the main aspects of a method proposed by the invention but also how to deploy said method by developing circuit designs.

The method in question is conceived for comparing different design versions of an electronic circuit, wherein said design versions are of the same data type representation and comprise several hierarchically related sheets.

In a first step 100, the sheet hierarchies of the design representations are analyzed. This hierarchy analysis comprises the determination of corresponding hierarchy levels represented by corresponding top-sheets. Starting from these hierarchy levels the resultant hierarchical structures are compared to identify added, removed and common sheets. Thus, in the first step those differences between said design versions are determined, which are represented by added and removed sheets.

After hierarchy analysis has been completed, differences between common sheets are determined in step 120 to identify modified sheets in a second step.

In advantageous embodiment of the present invention, the determination of modified sheets can be stopped for each pair of sheets after the first difference in that pair has been found, postponing the complete comparison until later.

Then, in a third step 130 of the method the combined sheet hierarchies are visualized wherein added, removed and modified sheets are marked. Thus, when the two designs are different versions of the same design under development, a user can easily locate design modifications and restrict further detailed examination to modified parts of the design.

In the example, illustrated in FIG. 1, the display of the combined hierarchies in step 130 is starting point for a user interaction in step 135 to select modified sheets for detailed exploration of the differences. As the detailed comparison of a given pair of sheets may have been postponed until then, detailed comparison could be carried out for selected sheets of the user's interest only, thus saving time and operating expense.

The detailed display of differences between selected sheets is object of step 140. These differences are determined by a detailed comparison of the selected sheets, which is performed in step 1200 or will be postponed until after step 130. As mentioned above, the execution of the detailed comparison depends on the data type representation of the design versions, i.e. the sheets to be compared.

In case of schematics a detailed exploration or comparison in step 145 comprises:

i. generating a list of instances for each of the sheets to be compared to identify added, removed and common instances;
ii. generating a list of parameters for all common instances to identify added, removed and common parameters;
iii. comparing the values of said common parameters to determine changed parameters;
iv. generating a list of all network connections for all common instances to identify added, removed and common network connections;
v. comparing the network names of said common network connections to determine differences in instance connectivity; and
iv. storing for later visualization said lists to document differences between common instances.

A comparison in case of layouts further comprises:

vii. generating a list of geometrical layers used in each corresponding layout to identify added, removed and common mask layers;
viii. comparing the common geometrical layers to determine geometrical differences and to classify said geometrical differences as added or removed geometrical details; and
ix. storing for later visualization said added and removed geometrical layers and said added and removed geometrical details to document geometrical differences between corresponding layouts.

For better comprehension of modifications the changed details in the design versions can be highlighted by marker shapes or other appropriate means. Besides, the option to toggle between the two design versions "reference" and "compare", showing in each case the same portion of the sheet, is very beneficial to point out design differences for a user on a single keystroke.

Figure 2:
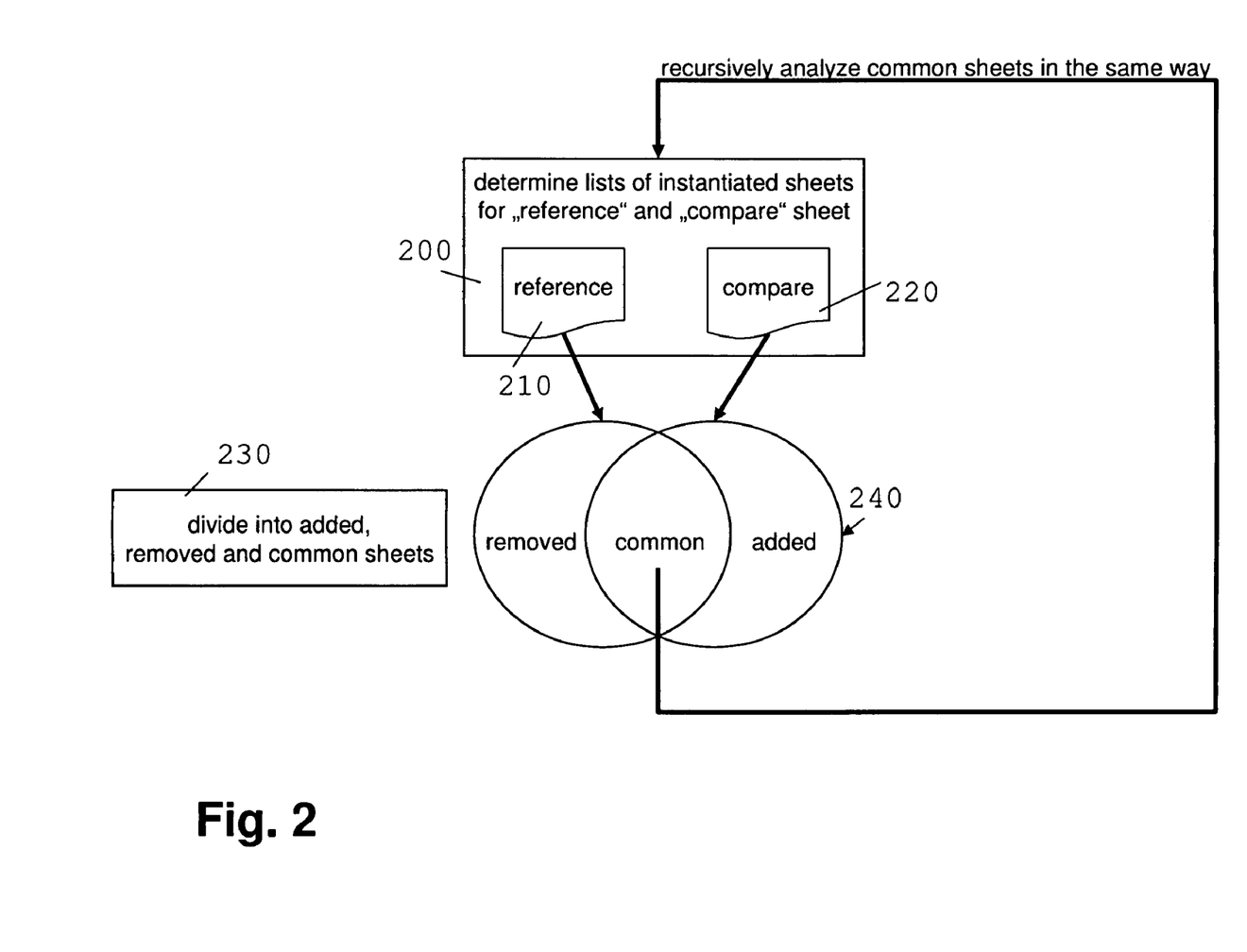
FIG. 2 shows a workflow of the hierarchy analysis according to an advantageous embodiment of the present invention.

One advantageous embodiment of step 100 in FIG. 1 is illustrated in FIG. 2. Here, the hierarchy analysis is carried out in a recursive procedure examining each hierarchy level of the design versions to be compared in the same way. To start this procedure corresponding top-sheets of a first hierarchy level have to be identified in said design versions. This is not explicitly shown in FIG. 2.

Then, for each top-sheet a 210 list of all sub-sheets is generated in step 200, wherein the sub-sheets are defined as all sheets which are referenced in the top-sheet one or multiple times.

In a next step 220, the resultant lists are compared to identify added, removed and common sub-sheets of said corresponding top-sheets. The result of this comparison is illustrated in the bottom part 240 of FIG. 2.

While the added and removed sheets already represent differences in the design versions to be compared, the common sheets have to be compared in more detail to identify modified sheets. Therefore, the common sheets are defined as new top-sheets of a next hierarchy level. Then, the next hierarchy level is analyzed in the same way as the first hierarchy level has been analyzed before. This procedure will be repeated as long as there are further sheets referenced in the top-sheet of a hierarchy level. Only when it is not possible to determine any sub-sheets for a top-sheet the hierarchy analysis is accomplished.

As mentioned above in connection with FIG. 1, differences between common sheets shall be determined in step 120 to identify modified sheets. Therefore, in an advantageous embodiment of the present invention illustrated in FIG. 3, the trivial equality of common sheets is checked first, to obtain a reduced set of common sheets to be analyzed in more detail, because these common sheets are not trivially equal and, thus, presumably modified. The check for "trivial equality" is an optional performance enhancement and could comprise e.g. a comparison of file sizes and/or checksums, a comparison of file names and/or version numbers.

Figure 3:
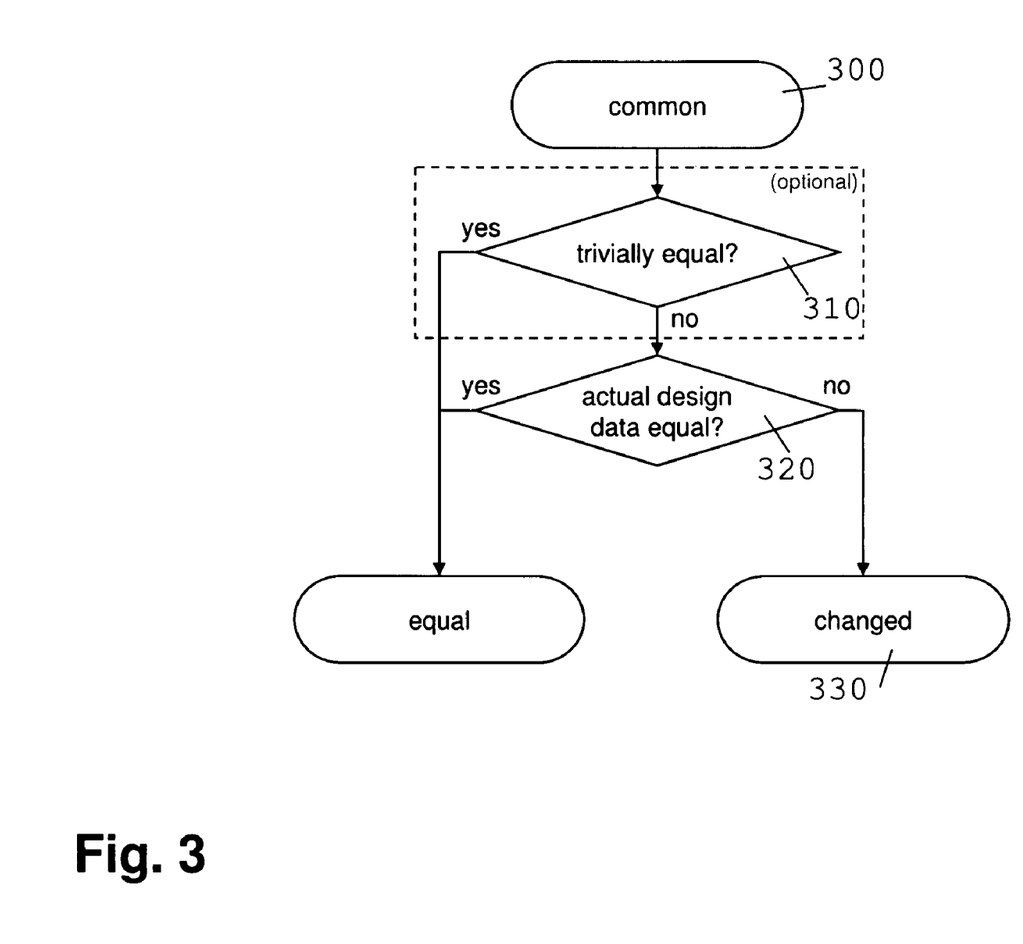
FIG. 3 shows steps of a difference determination method according to an advantageous embodiment of the present invention.

According to FIG. 3, the actual design data of the common sheets 300 in question is only compared in step 320 if the check for trivial equality in step 310 is negative. And only in case that there are differences in the actual design data the corresponding common sheet is marked as changed or modified in step 330 the display of the combined hierarchies in step 130.

Figure 4:
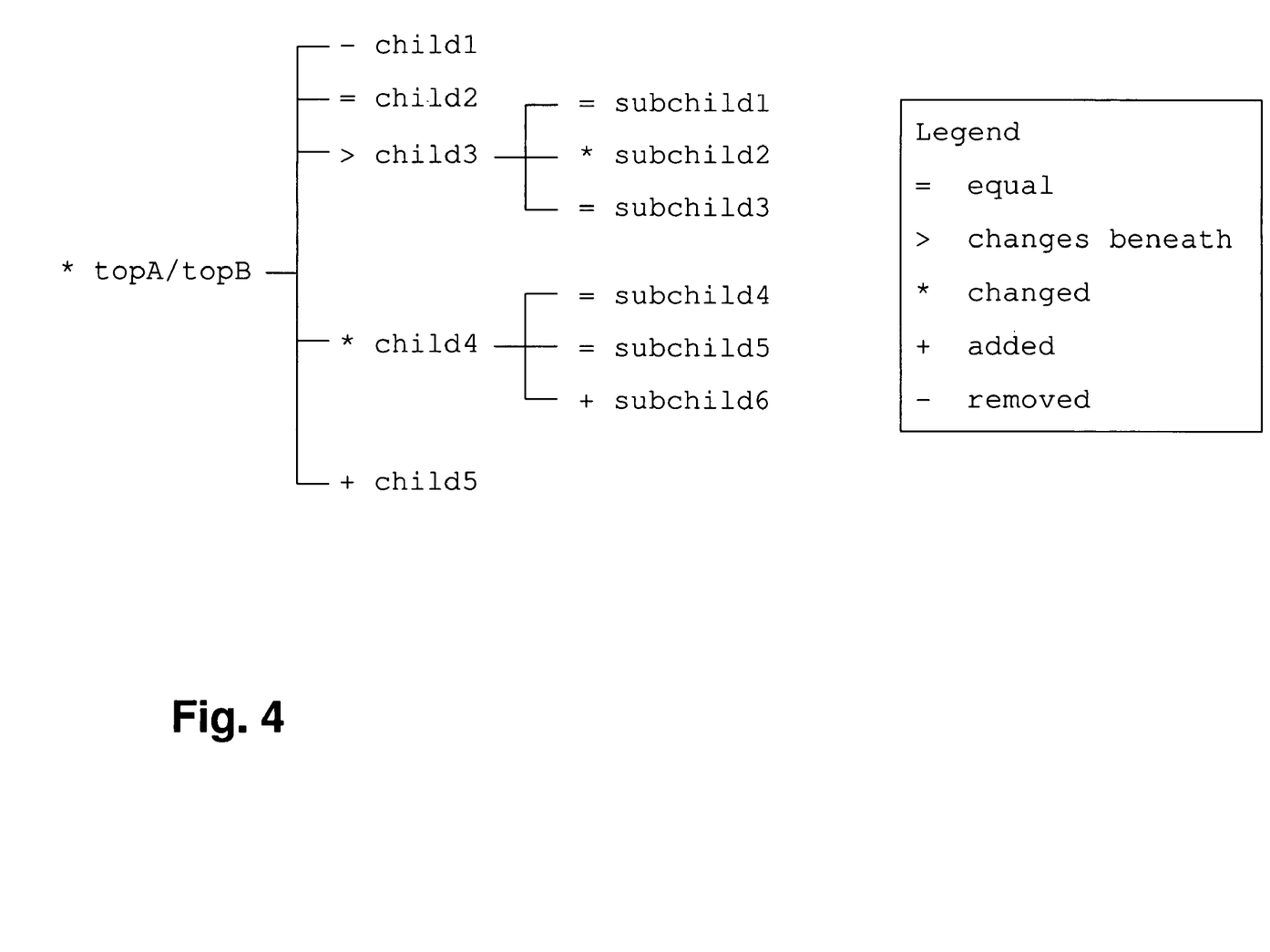
FIG. 4 shows an example for a display of the combined hierarchies of two compared design versions.

FIG. 4 illustrates a display resulting from step 3 of the method described in connection with FIGS. 1 to 3. The combined hierarchies of the designs to be compared are here represented in a tree structure. In the example shown in FIG. 4 the corresponding top-sheets of the first hierarchy level are defined as topA/topB. The added sheet "child5" is marked with a "+" sign, while the removed sheet "child1" is marked with a "−" sign. All sheets which are marked with a "*" comprise actual changes, while all sheets which are marked with a ">" comprise changes in at least one of the subordinate hierarchy levels. Thus, these sheets marked ">" lead the way to changed sheets.

The particular steps of a method in accordance to the present invention such as described above can be carried out by different computer program tools executed on a computer system.

Figure 5:
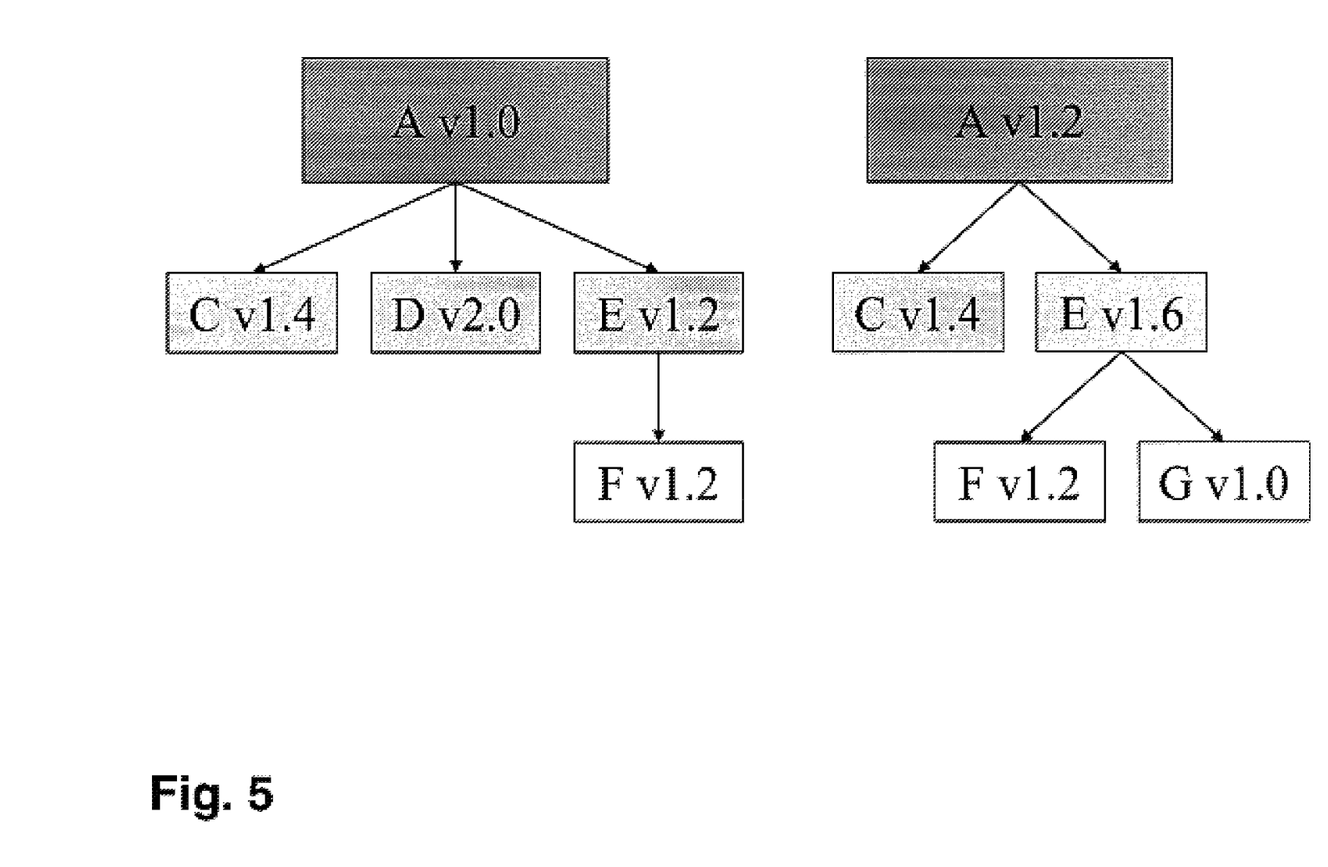
FIG. 5 shows the tree structures of two design version of an electronic circuit.

These steps will now be illustrated using a concrete example. FIG. 5 shows the tree structure for the sheets of two versions of the same design for an electronic circuit. The sheets A to F are annotated with a version number. So the top-sheet A has the version v1.0 in one design version and the version v1.2 in the other design version. Sheet A v1.0 comprises instances of the sheets C, D, and E. Sheet A v1.2 comprises instances of the sheets C and E only. Therefore the sheet D is "removed" in the newer design version, but the sheets C and E are "common".

Now the top-sheets C and E will be processed as they are labeled as "common". Since the top-sheet C has the same version v1.4 and does not comprise any sheet instances, the next top-sheet E will be processed. The top-sheet E v1.2 comprises an instance of the sheet F; the top-sheet E v1.4 comprises instances of the sheets F and G. Therefore G is "added" in the newer design version and F is "common". Now the following pairs of sheets need to be compared:

C v1.4 and C v1.4→equal due to the same version number (same time stamp, same checksum, etc.)
E v1.2 and E v1.6
F v1.2 and F v1.2→equal due to the same version number (same time stamp, same checksum, etc.)

Figure 6:
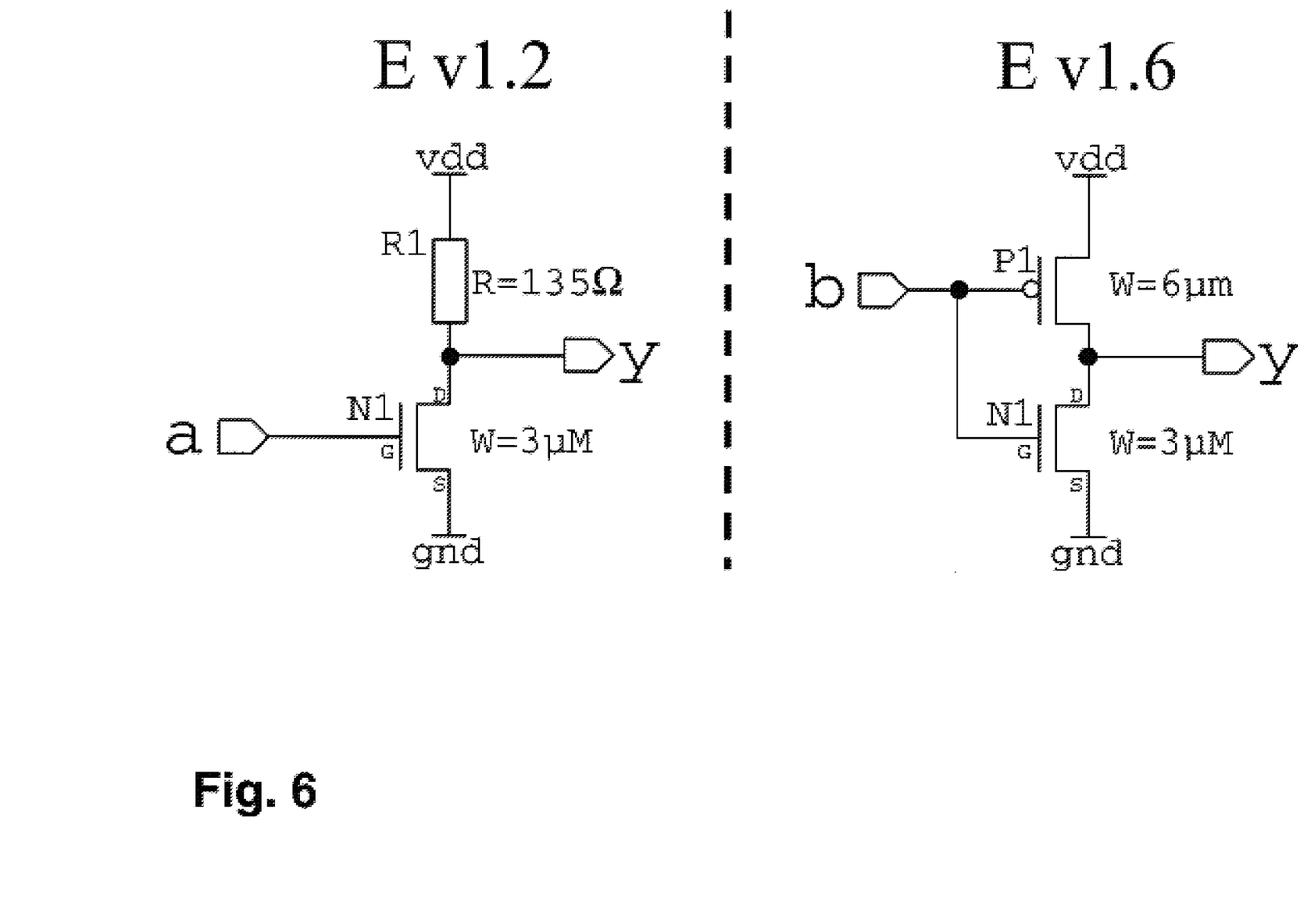
FIG. 6 shows two versions of a schematic for a design of a part of an electronic circuit.
Figure 7:
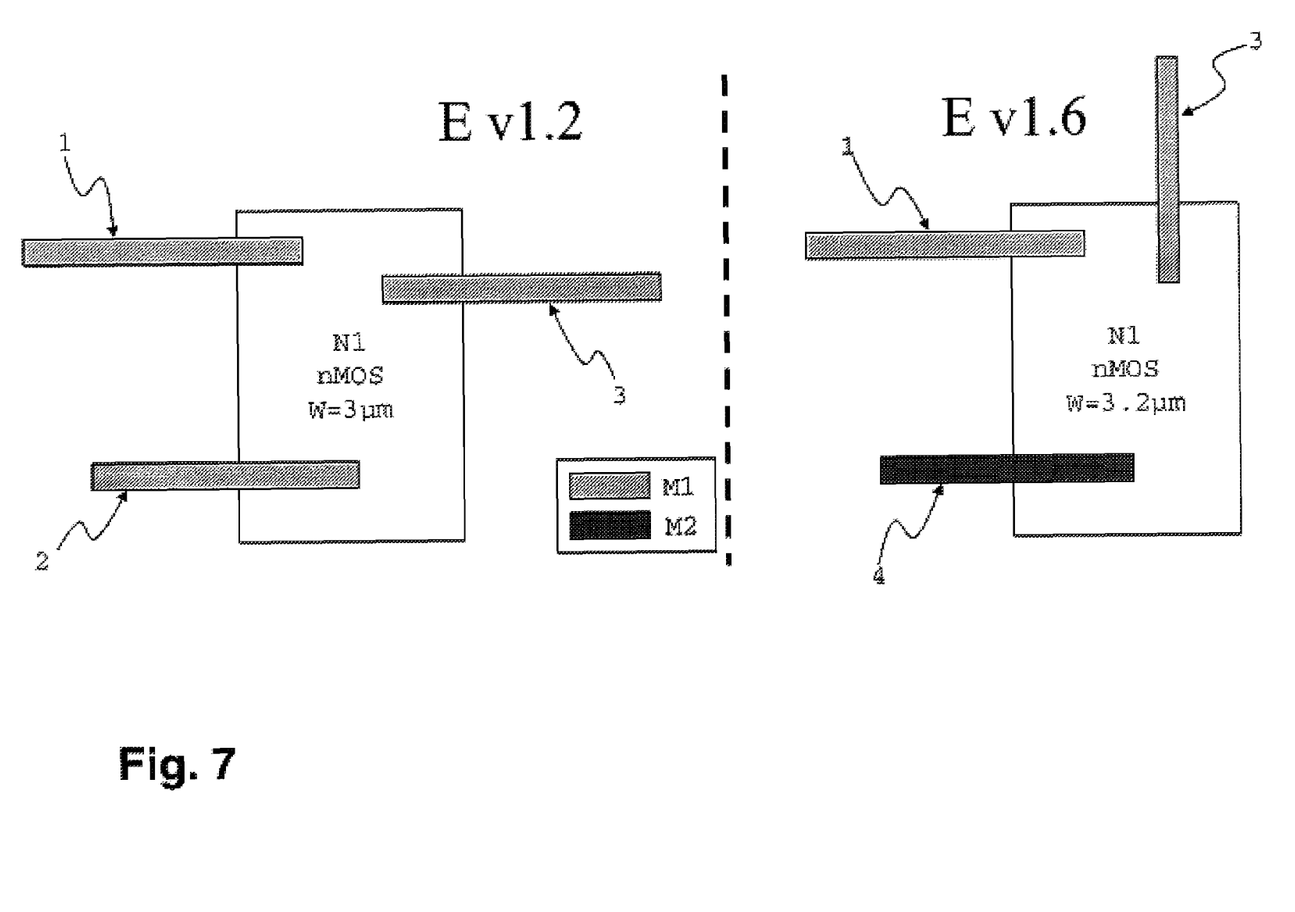
FIG. 7 shows two versions of a layout for a design of a part of an electronic circuit.

The comparison of E v1.2 and E v1.6 depends on the type of the sheets. FIG. 6 shows an example for schematics and FIG. 7 shows and example for layouts. In FIG. 6 the sheet E v1.2 comprises the instances R1 and N1 and E v1.6 comprises the instances P1 and N1. In this case, R1 is "removed" and P1 is "added" in the newer version of the design: N1 is "common".

In both versions N1 has the parameter W and no further parameters, so W is "common". N1 comprises in both versions also the connections G, D, and S, which are "common" therefore. In both versions D is connected to the net y and S is connected to gnd. However, G is connected to a in E v1.2 but G is connected to b in E v1.6.

E v1.2 comprises the connections a and y, and E v1.6 comprises the connections b and y. Therefore in E v1.6 the connection a is "removed", y is "common", and b is "added".

In both versions y is an outward connection, so therefore there is no change between the two versions.

In summary, for the comparison of the schematic E v1.6 with its previous version E v1.2, the following differences will be detected:

R1 is "removed"

P1 was "added"

N1 is changed as follows:

the connection G was changed from connecting to the net a to connecting to the net b     the sheet connection a was "removed"

the sheet connection b was "added"

For the layouts in FIG. 7 the instance N1 is "common" but the concrete values of the parameter W are different. E v1.2 comprises geometrical description data for the layer M1 but E v1.6 comprises geometrical description data for the layers M1 and M2. Therefore M1 is "common" but M2, comprising the shape 4, is "added" in E v1.6. When comparing the geometrical description data for M1, it will be revealed that shape 1 is "common" and shape 2 has been "removed" in E v1.6. The classification of shape 3 is dependant on the actual implementation.

An example implementation of the actual comparison steps is given as follows:

1. Start with the two top-sheets and add this pair together with the key value "root" in a table;

2. For both top-sheets determine the list of instances of sheets that they comprise;

3. Divide the sheets in the list into "added", "removed", and "common" sheets;

4. Determine for all sheets in each class a key value for the sheet name that does not depend on the sheet version;

5. If the key value is not found in the table, create a new record describing the sheet and add it to the table together with the key value;

6. If the key value was not found and the sheet is "added" or "removed", then also add the marker "added" or "removed" to the newly created table entry;

7. If a sheet is "common" and its key value is not found in the table, or, if it is found, and the pair in the table is either marked as "added" or "removed", then store the two different versions of the sheet as a pair in the table entry and mark it as "unchecked";

8. For all sheet pairs in the table that are marked as "unchecked", perform the following steps:

I) Test for trivial equality:

a) Do the two sheets have the same version number? If so, the sheets are trivially equal. Go to step 8.II;

b) Do the two sheets have equal file size? If not, the sheets may have been changed. Mark the sheet pair as "maybe different" and go to step 8.II;

c) Do the two sheets have equal file content? If so, the sheets are equal. Otherwise mark the sheet pair as "maybe equal";

II) Mark all sheet pairs as "equal" that are not marked as "maybe different" already;

III) Perform the steps 2 to 8 recursively for the current sheet pair;

9. Perform further tests for all sheet pairs in the table that are marked as "maybe different" to determine whether they are actually different or not;

10. Store the collected information in a data structure used for presenting the results of the comparison.

In step 9 various tests are possible depending on the type of the sheets. If the sheets are used for schematics, then step 9 can be further specified as follows:

S.1. For both sheet versions determine the list of instances of sheets that they comprise:

S.2. Divide the instances in the list into "added", "removed", and "common" instances;

S.3. For all "common" instances perform the following steps:

I) Determine the list of parameters and divide it into "added", "removed", and "common" parameters;

II) For all "common" parameters only keep those where the value is different between the instance pair and mark them as "changed";

III) Determine the list of connections and divide it into "added", "removed", and "common" connections;

IV) Keep only the "common" connections for which the name of the associated net has changed;

S.4. Deep only the "common" instances comprising "added", "removed", or "changed" parameters;

S.5. Determine for both versions of the sheet the list of outward connections and divide it into "added", "removed", and "common" connections;

S.6. For all "common" contacts keep those connections only for which the attributes have changed.

If the sheets are used for layouts, then step 9 can be further specified as follows;

L.1. For both sheet versions determine the list of instances of sheets that they comprise;

L.2. Divide the instances in the list into "added", "removed", and "common" instances;

L.3. For all "common" instances perform the following steps:

I) Determine the list of parameters and divide it into "added", "removed", and "common" parameters;

II) For all "common" parameters only keep those where the value is different between the instance pair and mark them as "changed";

L.4. Keep only the "common" instances comprising "added", "removed", or "changed" parameters;

L.5. Determine for both versions of the sheet the list of outward connections and divide it in "added", "removed", and "common" connections;

L.6. For all "common" connections keep those connections only for which the attributes have changed;

L.7. Determine for every version of the sheet the list of geometrical layers and divided into "added", "removed", and "common" geometrical layers;

L.8. Determine for all "common" geometrical layers the differences between the two versions using a logical exclusive or (XOR) operation on the geometrical description data;

L.9. Divide all the geometrical differences into "added" and "removed" geometrical differences;

L.10. Mark the geometrical description data as "added" and "removed" depending on the geometrical differences.

In step L.9 the geometrical description data of the geometrical differences are combined in a logical and (AND) operation with the geometrical description data of the two versions of the common geometrical layers.

The invention claimed is:

1. A computer-based method for comparing two design representations of different versions of a layout of electronic circuits, wherein the representations of the two designs comprise several hierarchically related sheets, said method comprising the steps of:
   a) analyzing the sheet hierarchies to identify added, removed and common sheets;
      ai. identifying corresponding top-sheets of a first hierarchy level in said versions;
      aii. generating a list of all sub-sheets for each top-sheet and comparing said lists to identify added, removed and common sheets of said corresponding top-sheets;
      aiii. defining said common sheets as corresponding top-sheets of a next hierarchy level; and
      aiii. repeating steps aii. to aiv. until at least one of the top-sheets does not comprise any sub-sheet, and
   b) determining differences between common sheets to identify modified sheets; and
   c) displaying the combined sheet hierarchy of the two design representations wherein added, removed and modified sheets are marked.

2. The method according to claim 1, wherein step b) comprises the steps of:
   i. checking equality; and
   ii. marking common sheets which are not equal;
      and wherein equality is determined by a comparison of file sizes and/or checksums, and/or a comparison of file names and/or version numbers.

3. The method according to claim 1, further comprising the step of:
   d) selecting a pair of modified sheets by user interaction for detailed examination and display of differences.

4. The method according to claim 3, wherein step d comprises the step of:
   i. generating a list of instances for each of the sheets to be compared to identify added, removed and common instances;
   ii. generating a list of parameters for all common instances to identify added, removed and common parameters;
   iii. comparing the values of said common parameters to determine changed parameters;
   iv. generating a list of all network connections for all common instances to identify added, removed and common network connections;
   v. comparing the network names of said common network connections to determine differences in instance connectivity; and
   vi. storing for later display said lists to document differences between common instances.

5. The method according to claim 4, wherein the design representations to be compared are layouts, step d further comprising:
   vii. generating a list of geometrical layers used in each corresponding layout to identify added, removed and common geometrical layers;
   viii. comparing the common geometrical layers to determine geometrical differences and to classify said geometrical differences as added or removed geometrical details; and
   ix. storing for later display said added and removed geometrical layers and said added and removed geometrical details to document geometrical differences between corresponding layouts.

6. The method according to claim 1, wherein step b comprises:
   i. generating a list of instances for each of the sheets to be compared to identify added, removed and common instances;
   ii. generating a list of parameters for all common instances to identify added, removed and common parameters;
   iii. comparing the values of said common parameters to determine changed parameters;
   iv. generating a list of all network connections for all common instances to identify added, removed and common network connections;
   v. comparing the network names of said common network connections to determine differences in instance connectivity; and
   vi. storing for later display said lists to document differences between common instances.

* * * * *